United States Patent [19]
Friederich et al.

[11] Patent Number: 5,313,058
[45] Date of Patent: May 17, 1994

[54] SEMICONDUCTOR OPTOELECTRONIC DETECTOR

[75] Inventors: Alain Friederich, Paris; Pierre Leclerc, Voisins-le-Bretonneux, both of France

[73] Assignee: Thomson-CSF, Puteaux, France

[21] Appl. No.: 849,366

[22] Filed: May 5, 1992

[30] Foreign Application Priority Data

Nov. 9, 1990 [FR] France .................. 90 13946

[51] Int. Cl.$^5$ .................. H01J 40/14; H01L 27/12
[52] U.S. Cl. .................. 250/214.1; 257/21
[58] Field of Search .................. 257/18–19, 257/21, 431, 415, 458–461; 250/231.1, 231.19, 214.1

[56] References Cited

U.S. PATENT DOCUMENTS

| | | | |
|---|---|---|---|
| 4,604,637 | 8/1986 | Ruhle et al. | 250/231.19 |
| 4,935,935 | 6/1990 | Reed et al. | |
| 4,952,792 | 8/1990 | Caridi | 257/18 |
| 5,012,304 | 4/1991 | Kash et al. | 257/18 |
| 5,065,205 | 11/1991 | Biefeld et al. | 257/18 |

FOREIGN PATENT DOCUMENTS

| | | |
|---|---|---|
| 0071589 | 2/1983 | European Pat. Off. |
| 65949 | 1/1973 | Luxembourg |

OTHER PUBLICATIONS

Zipperian, "InGaAs/GaAs, Strained-Layer Superlattice (SLS), Junction Photodetectors, LED's, Injection Lasers, and Fets. For Optoelect. IC. Appl." Proc. IEEE, IEDM 1984, pp. 524–527.

Journal of Vacuum Science and Technology: Part A. vol. 7, No. 31, May 1989, New York US pp. 609–615; C. Mailhiot et al.: "Modulation of internal piezoelectric fields in strained-layer superlattices grown along the [111] orientation".

Optical Engineering, vol. 25, No. 12, Dec. 1986, Bellingham US pp. 1267–1277; R. R. Whitlock et al.: "Streak and framing camera charge-transfer devices" p. 1268–p. 1269.

IEEE Photonics Technology Letters, vol. 1, No. 10, Oct. 1989, New York, US pp. 307–309; F. C. Jain, et al: "Multiple quantum well optical modulator structures using surface acoustic wave induced stark effect".

Primary Examiner—Michael Messinger
Attorney, Agent, or Firm—Oblon, Spivak, McClelland, Maier & Neustadt

[57] ABSTRACT

An optoelectronic detector using a photodetector (1) and a stress induction device for inducing elastic waves with the stress inducing device being mechanically coupled to the photodetector. The stress inducing device includes an excitation which permits the transmission of the elastic waves.

3 Claims, 3 Drawing Sheets

SEMICONDUCTOR OPTOELECTRONIC DETECTOR

BACKGROUND OF THE INVENTION

1. Field of the Invention

The invention relates to a semiconductor optoelectronic detector and in particular to a quantum well detector possessing a high detectivity permitting lesser sensitivity to noise.

2. Discussion of the Background

An optical detector uses:

photoconduction or the photovoltaic effect induced by a transition between the valence band and the conduction band or photoconduction induced by a transition from a localized level (associated with a well in a heterostructure or with a localized level in the forbidden band) towards the conduction or valence band.

The energy band detected is directly related to the energy of the forbidden band in the first case or to the level's depth in energy with respect to the band in the second case.

SUMMARY OF THE INVENTION

An essential characteristic of a photodetector is its capacity to distinguish a narrow band from noise. It is possible to increase this capacity by modulating the position in energy of the levels or of the bands. By way of a synchronous detection system, a signal is then obtained which is proportional to the derivative of the unmodulated spectrum with respect to the energy of the photons.

The invention therefore relates to an optoelectronic detector characterised in that it comprises a photodetector and a device inducing elastic waves, which are mechanically coupled.

BRIEF DESCRIPTION OF THE DRAWINGS

The various subjects and characteristics of the invention will emerge more clearly in the description which follows made by way of illustration and in the attached figures which represent.

DETAILED DESCRIPTION OF THE PREFERRED EMBODIMENTS

Modulation of the response of an optoelectronic detector can be obtained by modulating the photodetector material's band structure. The latter can be produced simply according to the invention by using the piezoelectric effect. Piezomodulation consists in applying a stress with sinusoidal time variation to the structure of the detector component. The whole band structure then oscillates about its zero stress position. In practice this piezomodulation is obtained:

by adhesively bonding the detector onto a piezoelectric material, by using as piezoelectric material the substrate on which the structure of the detector has been grown.

This supposes that the semiconductor used as substrate is a good semi-insulator (this being the case for GaAs and InP) and has an adequate piezoelectric coefficient (this being the case for GaAs).

The stress is easily applied in the plane orthogonal (001) to the axis of growth of the structure.

For a photodetector which uses modulation of the band structure, it is also possible to adjust the absorption edge by a continuous stress.

In the case of a photodetector using one or a series of wells, the modulation corresponding to the difference in the modulations of the bands of the wells and of the barriers is small, but the modulation of the width of the wells is profited from.

Figure 1:
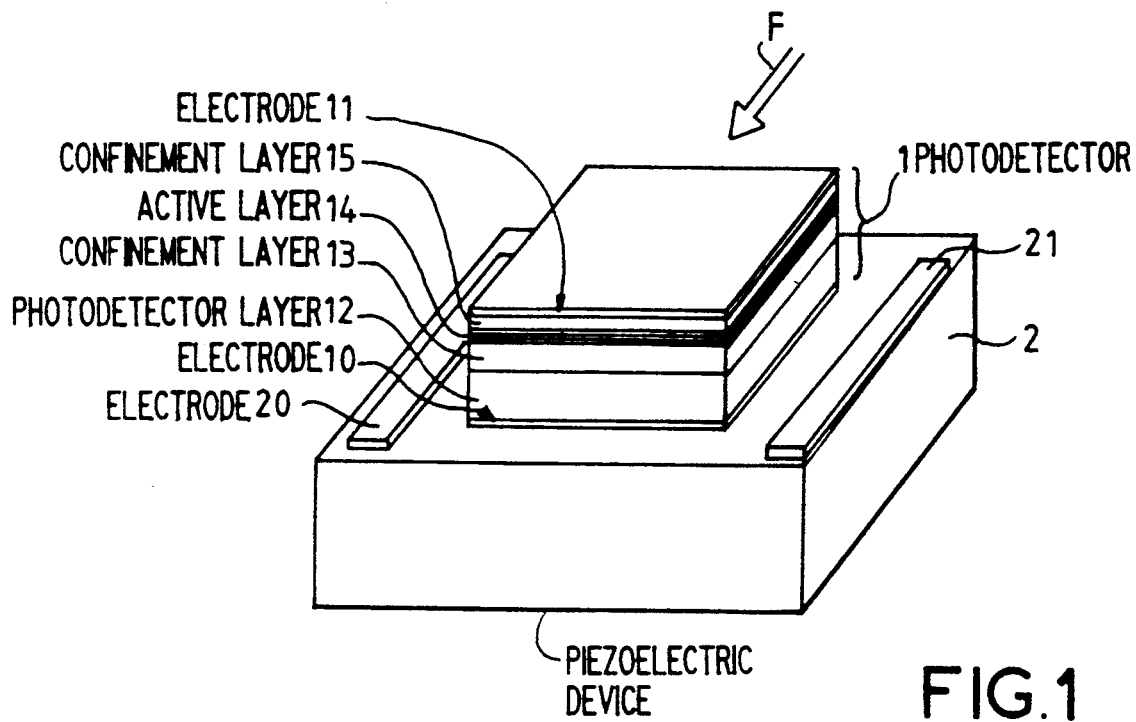
FIG. 1, an illustration of the principle of the device of the invention.

FIG. 1 represents a general illustration of a device according to the invention in which the detector 1 is arranged on a piezoelectric device 2. The detector 1 is produced on a substrate 12 and possesses an active part 14 situated between two confinement layers 13 and 15. Two electrodes 10 and 11 are situated on either side of the device. According to the illustration of FIG. 1, the electrode 11 is transparent so that a luminous flux F can reach the active zone of the device.

The piezoelectric device 2 possesses two electrodes 20 and 21 enabling an alternating excitation voltage to be applied. The device 2 can thus apply stresses to the detector 1.

Figure 2:
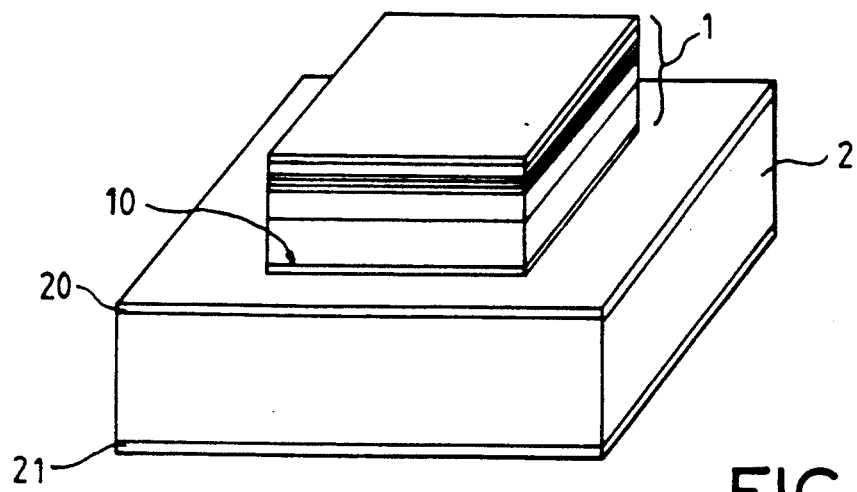
FIG. 2, a first illustrative embodiment of the device of the invention.

According to an illustrative embodiment represented in FIG. 2, the electrodes 20 and 21 are situated on either side of the piezoelectric device 2. According to a variant not shown, the electrodes 10 and 20 of the detector 1 and of the piezoelectric can be one and the same electrode. The electrode 20, for example, is not then produced.

In FIG. 2, the piezoelectric device 2 has been associated with the substrate of the detector 1. According to a variant not shown, the device 2 can be associated (by adhesive bonding, for example) with the upper face of the detector. The substrate or the piezoelectric device should be transparent. It is also possible, according to a known art, to remove the substrate.

Figure 3:
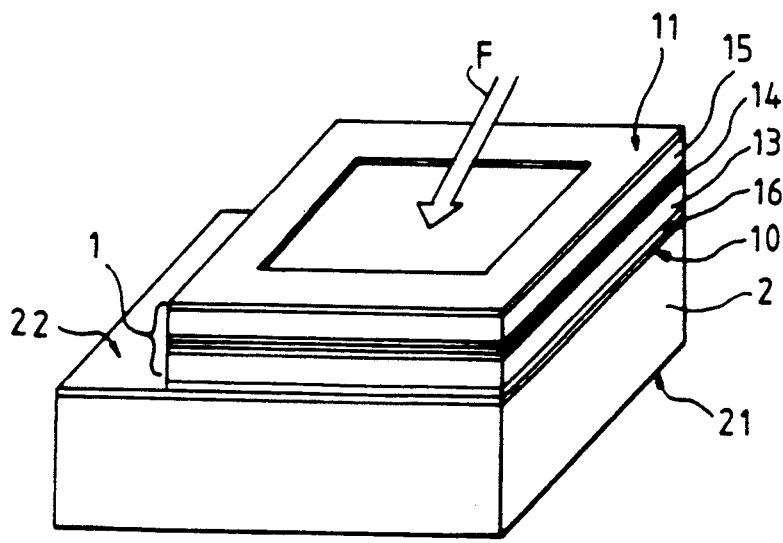
FIG. 3, a variant embodiment of the device of FIG. 2.

According to the illustrative embodiment of FIG. 3, the detector 1 is produced on a substrate 2 of a piezoelectric material (GaAs, for example). To do this, the substrate 2 possesses two electrodes 10 and 21.

The detector 1 is produced on the electrode 10 after depositing an ohmic contact layer and any other technologically required adaptation layer. A contact-taking region 22 is provided on the electrode 10 of the substrate 2.

The detector has a structure similar to that described earlier. The electrode 11 has been provided with an opening to permit passage of the luminous flux F to be detected.

Figure 4:
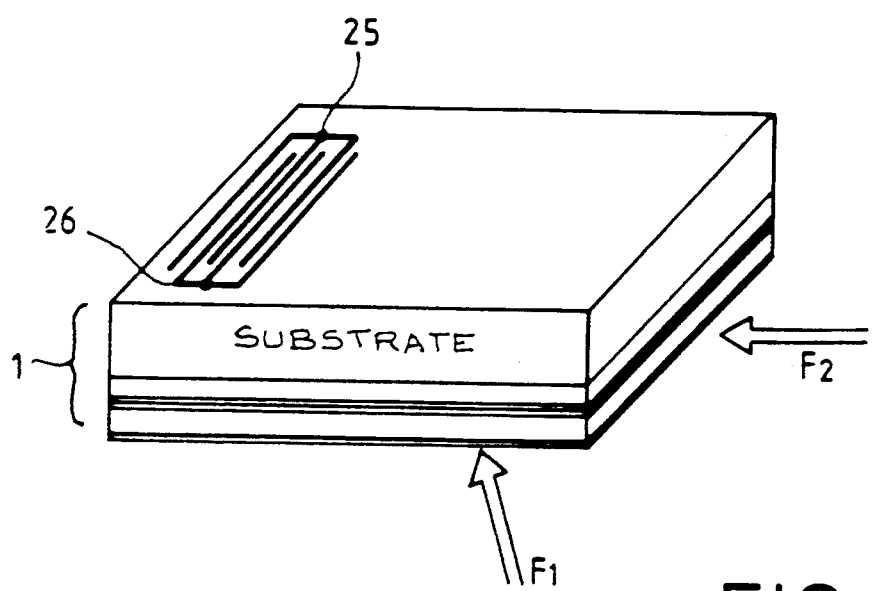
FIG. 4, another illustrative embodiment of the device of the invention.

According to the illustrative embodiment of FIG. 4, a face of the detector 1 possesses interdigital electrodes 25 and 26 which can be connected to the a.c. electrical energy source and enable elastic waves to be induced in the detector.

According to the illustration of FIG. 4, these electrodes 25 and 26 are produced on the rear face of the substrate.

The detector can equally well detect a wave directed along F1 as along F2.

In the foregoing, illustrative embodiments have been given of devices inducing elastic waves in a photodetector. However, these devices could take other forms.

The essential feature is to associate with a photodetector a device capable of inducing, under the effect of an excitation, one or more stresses in the photodetector.

It is also expedient to point out that the photodetector can either be adhesively bonded, or produced (by epitaxy, for example) on the device inducing stresses.

Figure 5:
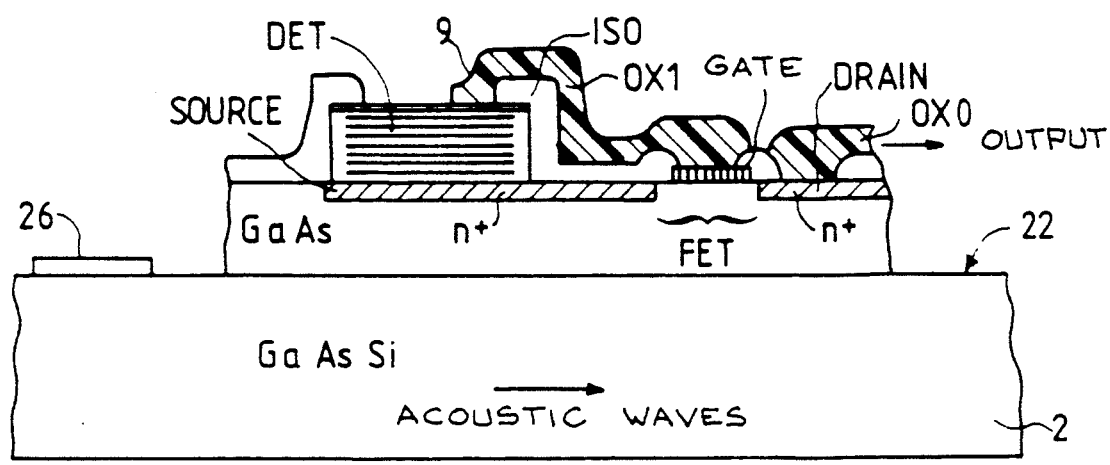
FIG. 5, an illustrative embodiment detailed according to the invention.

FIG. 5 represents an illustration of a detailed embodiment of the device according to the invention.

This device includes:

a substrate 2 equipped, on a face 22, with a device 26 inducing elastic waves, a detector DET arranged on the face 22 of the substrate, a transistor FET for controlling the detector DET, likewise arranged on the face 22 and including a source, a gate and a drain as well as connections OX1 and OX0. The connection OX1 is evidently insulated from the detector DET by an insulator ISO.

It is clearly evident that the foregoing description has been made merely by way of illustration and that other variants can be envisaged without departing from the scope of the invention. In particular, the associating of the device inducing stresses with the photodetector can take forms other than those indicated.

We claim:

1. An optoelectronic detector comprising:
   a photodetector having at least one quantum well situated on one face of a photoelectric substrate;
   a piezoelectric transducer mechanically coupled to said photodetector wherein a second face of said photoelectric substrate, opposed to said first face, is coupled to said piezoelectric transducer and wherein said photodetector includes one of a transparent electrode and an electrode having an opening for receiving radiation to be detected.

2. The optoelectronic detector according to claim 1 further including at least two electrodes situated on said piezoelectric transducer for receiving a.c. energy to produce at least one elastic wave to be induced.

3. The optoelectronic detector according to claim 1 further including a common electrode between said piezoelectric transducer and said photodetector.

* * * * *

UNITED STATES PATENT AND TRADEMARK OFFICE
CERTIFICATE OF CORRECTION

PATENT NO. :   5,313,058
DATED      :   May 17, 1994
INVENTOR(S):   Alain FRIEDERICH, et al.

It is certified that error appears in the above-indentified patent and that said Letters Patent is hereby corrected as shown below:

On the title page, Items [22], [86], and [87], the PCT information has been omitted and should read as follows:

--[22]  PCT Filed:           Nov. 7, 1991

[86]  PCT No.:             PCT/FR91/00868
        §371 Date:           May 5, 1992
        §102(e) Date:        May 5, 1992

[87]  PCT Pub. No.:        WO92/09106
        PCT Pub. Date:       May 29, 1992--

Signed and Sealed this

Sixteenth Day of August, 1994

Attest:

BRUCE LEHMAN

Attesting Officer            Commissioner of Patents and Trademarks